(12) United States Patent
Takeda et al.

(10) Patent No.: US 7,777,167 B2
(45) Date of Patent: Aug. 17, 2010

(54) RADIATION IMAGING APPARATUS AND RADIATION IMAGING SYSTEM HAVING A LIGHT SOURCE WITH LIGHT FOR CALIBRATION OF CONVERSION ELEMENTS

(75) Inventors: Shinichi Takeda, Honjo (JP); Masato Inoue, Kumagaya (JP)

(73) Assignee: Canon Kabushiki Kaisha, Tokyo (JP)

( * ) Notice: Subject to any disclaimer, the term of this patent is extended or adjusted under 35 U.S.C. 154(b) by 161 days.

(21) Appl. No.: 12/293,510

(22) PCT Filed: Oct. 26, 2007

(86) PCT No.: PCT/JP2007/071352
§ 371 (c)(1),
(2), (4) Date: Sep. 18, 2008

(87) PCT Pub. No.: WO2008/053978
PCT Pub. Date: May 8, 2008

(65) Prior Publication Data
US 2009/0250592 A1 Oct. 8, 2009

(30) Foreign Application Priority Data
Nov. 1, 2006 (JP) .............................. 2006-297720
Oct. 24, 2007 (JP) .............................. 2007-276519

(51) Int. Cl.
*G01J 1/32* (2006.01)
(52) U.S. Cl. .................................... 250/205; 250/208.1
(58) Field of Classification Search ................. 250/205, 250/208.1, 214 R, 559.1, 370.09–370.11, 250/363.09; 378/98.3–98.8, 207, 97; 356/326–328
See application file for complete search history.

(56) References Cited

U.S. PATENT DOCUMENTS

| 4,980,553 | A | 12/1990 | Henry ......................... 250/369 |
| 6,271,880 | B1 | 8/2001 | Kameshima et al. ......... 348/244 |
| 6,359,965 | B1 * | 3/2002 | Finkler et al. ............... 378/98.3 |
| 6,965,111 | B2 | 11/2005 | Endo ..................... 250/370.11 |
| 2004/0079891 | A1 | 4/2004 | Sato et al. ............... 250/370.12 |
| 2004/0183025 | A1 | 9/2004 | Sato ...................... 250/370.11 |

FOREIGN PATENT DOCUMENTS

| JP | 2-22590 | 1/1990 |
| JP | 9-266552 | 10/1997 |
| JP | 10-186045 | 7/1998 |
| JP | 2002-40144 | 2/2002 |
| JP | 2004-33659 | 2/2004 |
| JP | 2004-146769 | 5/2004 |
| JP | 2004-281882 | 10/2004 |
| JP | 2005-283261 | 10/2005 |

* cited by examiner

*Primary Examiner*—Que T Le
(74) *Attorney, Agent, or Firm*—Fitzpatrick, Cella, Harper & Scinto

(57) ABSTRACT

A radiation imaging apparatus including: a plurality of conversion elements being arranged in one-dimensional or two-dimensional array on a substrate, and converting an incident radiation into an electric signal; and a light source for calibration emitting a light to the conversion elements. During a light output adjustment period for driving the light source, a driving level of the light source is adjusted based on a control signal produced by comparing an output signal from a conversion element with a predetermined initial output signal.

14 Claims, 13 Drawing Sheets

RADIATION IMAGING APPARATUS AND RADIATION IMAGING SYSTEM HAVING A LIGHT SOURCE WITH LIGHT FOR CALIBRATION OF CONVERSION ELEMENTS

TECHNICAL FIELD

The present invention relates to a radiation imaging apparatus that images an object by irradiating radiation to the object. The radiation imaging apparatus is used especially for a medical X-ray imaging apparatus or a non-destructive inspection apparatus used for radiographing or diagnosis in a hospital.

BACKGROUND ART

In recent years, there has been proposed and commercialized an X-ray imaging apparatus which uses a solid-state image pickup device, such as CCD or amorphous silicon semiconductor. The X-ray imaging apparatus is a system which directly digitalizes X-ray images of a patient with a plurality of photoelectric conversion elements as imaging devices arranged in two-dimensional array to read the digitalized images through a scintillator (a visible light converting phosphor), as is the case with a conventional film system. The X-ray imaging apparatus, providing digital images almost in real time, has more significant advantages than the above-described film system or a photostimulable phosphor system. Especially, since the amorphous silicon can be prepared with a large area, an X-ray imaging apparatus with such amorphous silicon can image even a large site as seen in chest radiographing at the same magnification. Accordingly, the X-ray imaging apparatus, having high utilization efficiency of light, is expected to provide a high S/N ratio.

However, in producing many photoelectric conversion elements having large areas using amorphous silicon thin-film, a trace quantity of impurities mixed during a production process or an increase in the quantity of dangling bond causes a crystal lattice defect level in the film, which acts as a trapping level and results in unnecessary dark currents in a photoelectric conversion process to decrease an S/N ratio. To drive a photoelectric conversion substrate for relieving these dark currents, there is proposed a method for waiting for several to a few tens of seconds after photoelectric conversion elements (or switching devices) are biased, so as to relieve dark currents, and thereafter conducting photoelectric conversion. However, application of this method to an X-ray imaging apparatus causes the following problem: a cycle of radiographing a plurality of patients is increased or the operability of the apparatus is degraded.

Accordingly, to solve such a problem, there has been proposed a radiation imaging apparatus such as a apparatus disclosed in Japanese Patent Application Laid-Open No. 2004-33659 or Japanese Patent Application Laid-Open No. H02-22590.

The radiation imaging apparatus is provided with a light source including of a combination of an LED (light emitting diode) and a light guide plate on a photoelectric conversion substrate and emitting a light in a surface manner or a sheet-shaped light source using an EL (electroluminescence) device. The light source promotes charge injection into the trapping level of a photoelectric conversion element by emitting the light transmitted by the light source to the photoelectric conversion element, and is used for an optical calibration operation improving the characteristics of the photoelectric conversion element. Furthermore, Japanese Patent Application Laid-Open No. H10-186045 discloses a radiation detection apparatus which can detect optical I/O characteristics of a photoelectric transducer and a phosphor without need of irradiating radiation and correct radiation images using the detection results.

DISCLOSURE OF THE INVENTION

However, in conducting optical calibration by a light source, a decrease in light emission intensity due to aging of the light source makes it difficult to emit the quantity of light (light emission intensity×light emission period) effective for photoelectric conversion elements at the same setting as a condition in initial use. This is because a light emitting device such as LED or EL device, in which deterioration due to driving, a decrease in light emission intensity with aging due to invasion of environmental moisture or deterioration due to radiation damage is significant, produces a reduced light source output under initially established conditions such as supply voltage. By the quantity of light obtained at the initially established optical calibration setting, the quantity of light enough to produce a sufficient optical calibration effect will not be given to photoelectric conversion elements in long-term use.

Such a reduced light source output decreases an output of the photoelectric conversion element with the light source on, so that the dark current in the output of the photoelectric conversion element increases after light source off to the photoelectric conversion element, thus decreasing an S/N ratio.

Accordingly, a radiation imaging apparatus with high image quality (high S/N ratio) and short radiographing cycle has a problem of no long-term reliability. It may be thought to increase initial light emission intensity sufficiently, for example, to set a voltage at a higher level in consideration of light source deterioration. However, this eventually accelerates drive deterioration, so that it is difficult to extend the time to obtain required minimum quantity of light.

As described above, the photoelectric conversion substrate with a large area using amorphous silicon has an acceleration effect by an optical calibration operation with a light source provided, against a problem of a decrease in S/N ratio due to a crystal lattice defect level in a thin-film. However, deterioration of the newly provided light source makes it difficult to maintain the effect over a long-term use, thus generating a problem of reducing the service life of a radiation imaging apparatus.

In view of the aforementioned problems, it is an object of the present invention to provide a radiation imaging apparatus with a light source, capable of restraining degradation of characteristic changes by reduction in an optical calibration effect due to deterioration of the light source in a long-term use and a decrease in S/N ratio caused by an increase in dark currents.

A radiation imaging apparatus according to the present invention includes:

a plurality of conversion elements being arranged in one dimensional or two dimensional array on a substrate, and converting an incident light into an electric signal;

a light source for irradiating the conversion elements with light for calibration of the conversion elements; and a comparing unit for comparing an output signal from the conversion element with a predetermined initial output signal, to adjust a driving level of the light source.

According to the present invention, a quantity of light irradiation to a conversion element can be kept constant within a light source emission period (a light output adjustment period) by performing light source drive adjustment promoting an optical calibration effect based on an output signal from the conversion element for converting radiation or light into an electric signal. Therefore, the quantity of light required to obtain a stable optical calibration effect can be controlled for a long period of time even if light source intensity lowers due to deterioration of the light source in a long-term use. Furthermore, the present invention also provides a radiation imaging apparatus with long service life, which has a high S/N ratio, high sensitivity, a short radiographing cycle and high operating ease and can maintain its performance for a long period of time.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Hereinafter, embodiments of the present invention will be described. First, a radiation imaging apparatus with an LED light source and optical calibration operation will be described as a comparative example with a conventional apparatus.

Comparative Example

Figure 11:
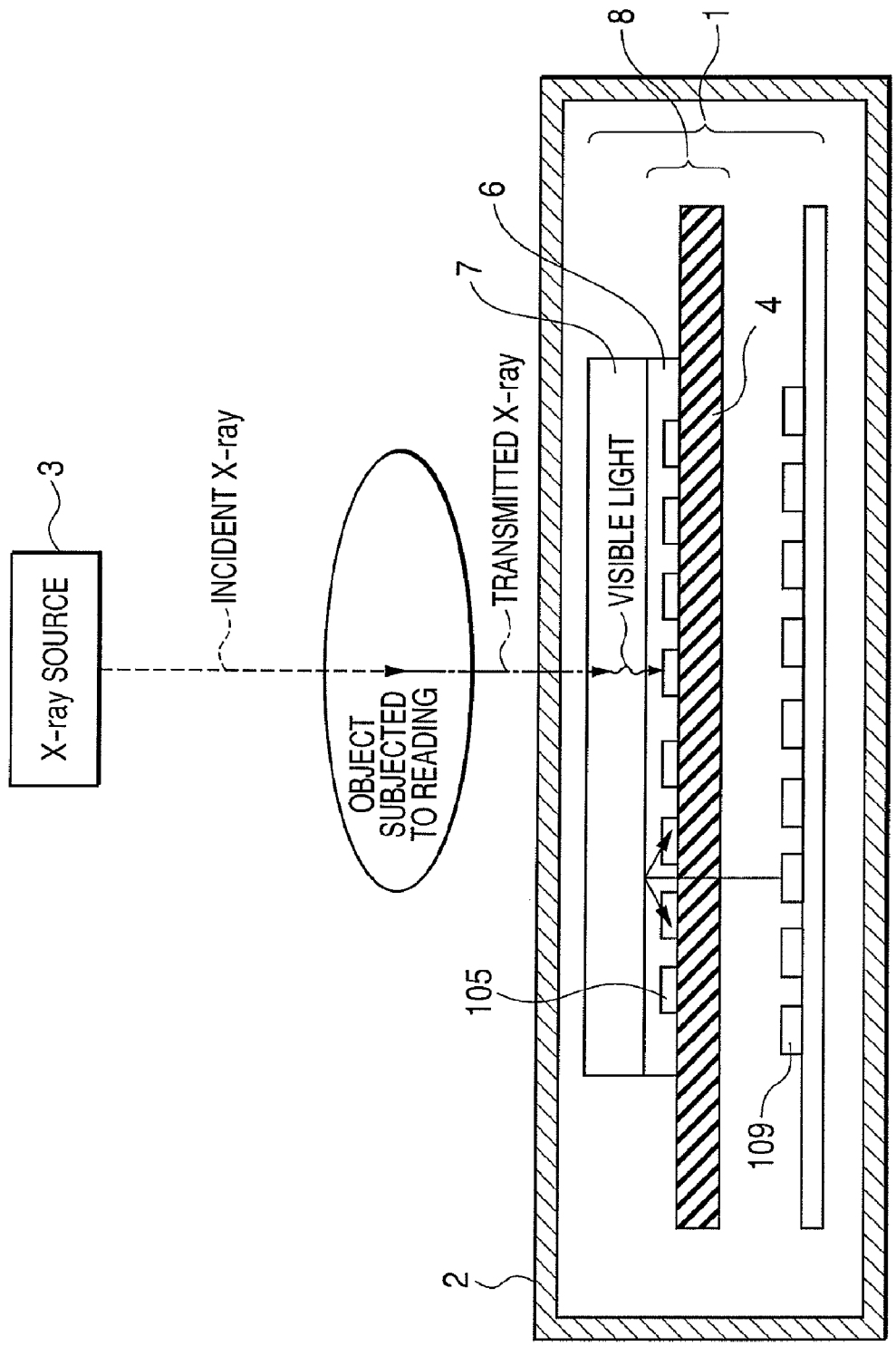
FIG. 11 is a schematic cross-sectional view illustrating a radiation imaging apparatus with an LED light source according to a comparative example.

FIG. 11 is a schematic cross-sectional view illustrating a radiation imaging apparatus with an LED light source according to a comparative example.

In FIG. 11, a radiation imaging apparatus 1 has a photoelectric conversion substrate 8 including a scintillator 7 as a wavelength converter and photoelectric conversion elements (photo diodes) 105 formed on an isolated substrate 4 and an LED light source 109, which are covered with a chassis 2. For the chassis 2, a material with very little X-ray absorption may be used, and a metal such as aluminum or stainless steel is inexpensive and is suitable because of excellent strength. An X-ray source 3 is an X-ray source for imaging an object subjected to reading (an object).

FIG. 11 is a cross-sectional view of a radiation imaging apparatus configuration, where photoelectric conversion elements and LEDs are arranged in two-dimensional manner in a paper-depth direction. A pair of a photoelectric conversion element and a switching device may be arranged on an isolated substrate as one pixel, which is omitted in FIG. 11. Generally, the switching device arranged on the isolated substrate is an amorphous or crystalline thin-film transistor.

In FIG. 11, an X-ray radiated from the X-ray source 3 is let in an object subjected to reading. The transmitted X-ray which has passed through the object subjected to reading reaches the scintillator 7. The scintillator 7 absorbs the X-ray and excites a light emission center of the inside of the scintillator to emit a visible light. The visible light from the scintillator 7 is emitted to light-intercepting surfaces of the photoelectric conversion elements 105 arranged on the isolated substrate 4 and is photoelectrically converted by the light-intercepting surfaces. Each of the photoelectric conversion elements 105 is covered with a protective layer 6 for improving moisture resistance. In the case where a pair of a photoelectric conversion element and a switching device is arranged as one pixel, the pixel is covered with the protective layer 6.

The isolated substrate 4 primarily uses transparent glass with a little alkaline component as a material thereof. The scintillator 7 uses $Gd_2O_2S$:Tb, CsI:Tl or the like as a material thereof.

On the other hand, the light (visible light) emitted from the LED light source 109 disposed below the isolated substrate 4, after passing through the isolated substrate 4 and side surfaces of the photoelectric conversion elements 105, is reflected by the scintillator 7 and emitted over the light-intercepting surfaces of the photoelectric conversion elements 105. The scintillator 7 has different reflective characteristics of the light from the LED light source 109, depending upon a material thereof. As the material for the scintillator 7, materials which do not completely absorb the light and more specifically, only several percents of light will reach the photoelectric conversion elements may be used.

Figure 12:
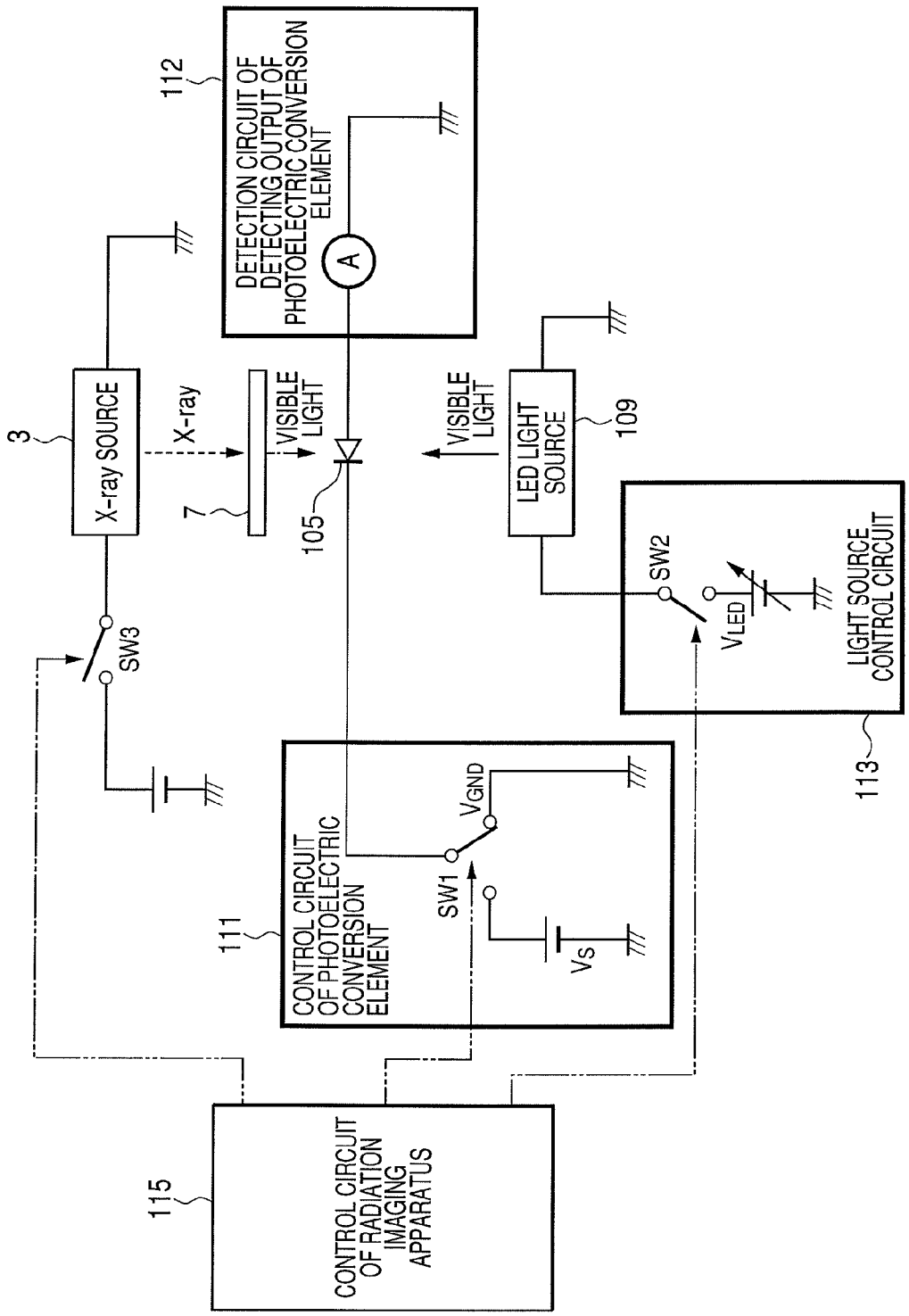
FIG. 12 is a circuit diagram of one pixel of a photoelectric conversion element in the radiation imaging apparatus.

FIG. 12 is a circuit diagram of one pixel of a photoelectric conversion element in the radiation imaging apparatus as a comparative example.

In the comparative example, the photoelectric conversion element 105 indicates a PIN photodiode and, as the material thereof, one of amorphous silicon and crystalline silicon may be used.

The cathode side of a diode of the photoelectric conversion element 105 is connected to an SW1 of a photoelectric conversion element control circuit 111, and the anode side thereof is connected to a photoelectric conversion element output detection circuit 112 of an ammeter or the like. In the case where a pair of the photoelectric conversion element and a switching device is arranged on an isolated substrate as one pixel, the switching device is electrically connected between the anode side of the photoelectric conversion element 105 and the photoelectric conversion element output detection circuit 112. The other side of the SW1 can be switched so as to be connected with one of a power supply ($V_S$) for giving a bias to the photoelectric conversion element 105 and zero bias ($V_{GND}$). A light source control circuit 113 controls lighting of the LED light source and includes a supply power source $V_{LED}$ and a switch SW2 for controlling lighting on/off.

Further, each circuit receives and delivers a control signal from/to a radiation imaging apparatus control circuit 115 which governs timing of the whole radiation imaging apparatus to control the operation.

The X-ray radiographed from the X-ray source 3 is radiographed to and passes through an object subjected to reading (not illustrated) and impinges over the scintillator 7. The X-ray is absorbed in the scintillator 7 and converted into a visible light. The visible light from the scintillator 7 is emitted to the photoelectric conversion element 105.

The LED light source 109 emits light to the photoelectric conversion element over an optical path separated from X-ray. A switch SW3 is for lighting the X-ray source 3.

Figure 13:
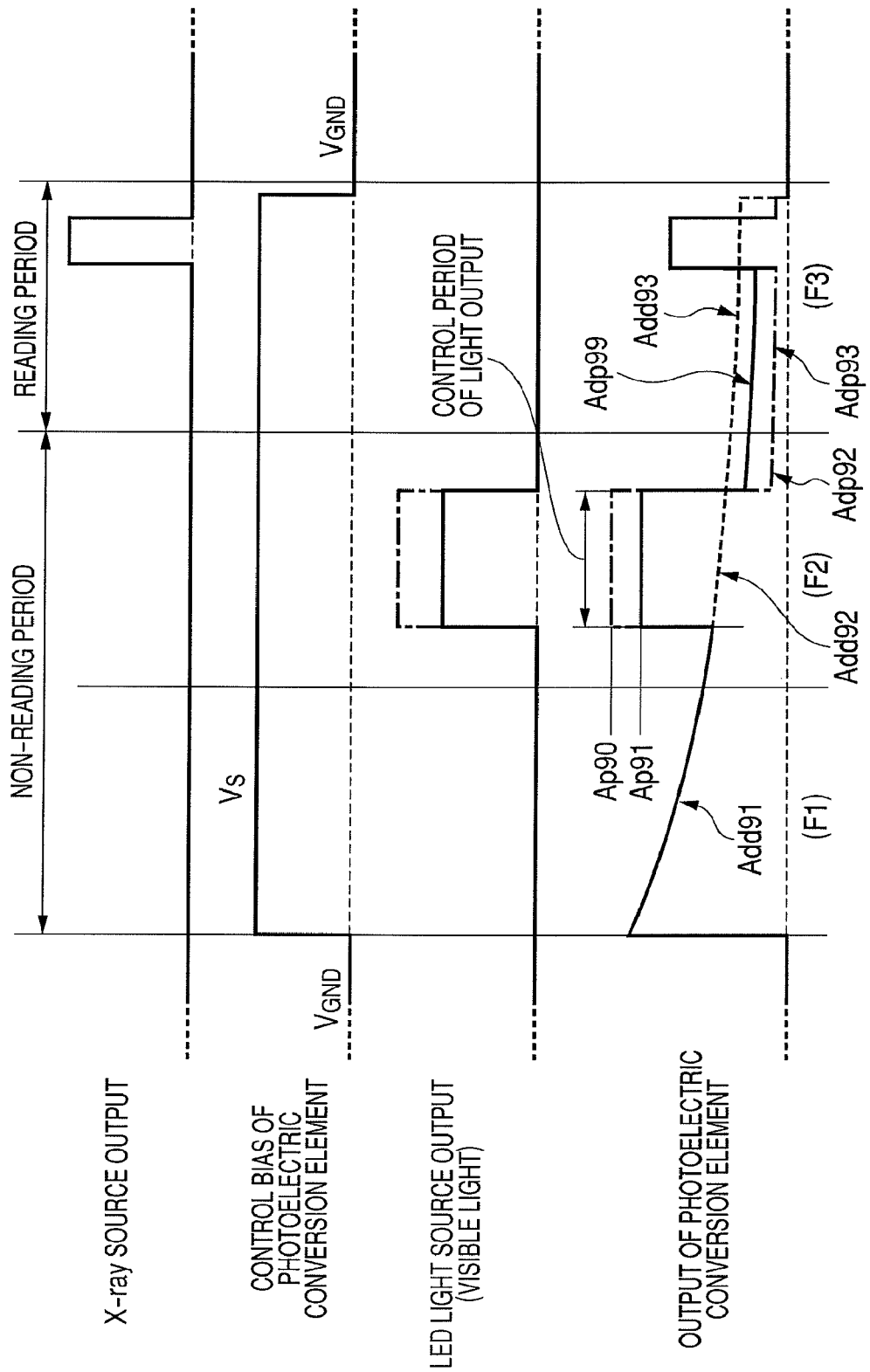
FIG. 13 is an operational timing chart of a circuit in the radiation imaging apparatus.

FIG. 13 is an operational timing chart of a circuit in the radiation imaging apparatus of the comparative example and describes X-ray source output, LED light source output, bias of a photoelectric conversion element and output (output signal) of the photoelectric conversion element.

In FIG. 13, reference characters (F1) and (F2) each denote a non-reading period and (F3) denotes a reading period. During the non-reading period, when a bias voltage is given to the photoelectric conversion element 105 by the bias power supply ($V_S$) while the X-ray source 3 and the LED light source 109 are in an off state, dark currents Add91, Add92, Add93 pass through the photoelectric conversion element 105. The state is indicated by solid-dot lines of an output of the photoelectric conversion element. Ideally, the dark currents is desired to be zero, but in reality, not zero. Even upon power-ON, a constant current does not run, but the dark current becomes large as indicated by Add91 upon power-ON and attenuates with time as indicated by Add92 and Add93.

Generally, if a PIN photodiode is used as a photoelectric conversion element, which is mainly made of an amorphous silicon semiconductor, a crystal lattice defect level is formed with dangling bond in an amorphous semiconductor film or impurities mixed during a production process. The crystal lattice defect level acts as a trapping level. More specifically, immediately after or before power-ON, electrons or holes are trapped, and after several to several tens of seconds pass, thermal excitation is performed at a conduction band or a valence band, so that a conduction current (dark current) runs. It is said that especially, interface portions between a P layer and an I layer and between the I layer and an N layer have many trapping levels, and they are thought to contribute to the dark current. Moreover, it is thought that blocking characteristics of the P layer and the N layer are not complete and a component of the dark by carriers flowing into the inside of the I layer from the outside increases.

It is said that in utilizing a crystalline PIN photodiode without using an amorphous semiconductor film, trapping levels are not so many as amorphous, depending upon process conditions to be prepared or equipment. However, the interface portion between the P layer and the I layer or the interface portion between the I layer and the N layer has much crystal lattice mismatching, and the trapping level is not zero and has a tendency of an output of a photoelectric conversion element as illustrated in FIG. 13.

If a dark output (dark current) of the photoelectric conversion element is waited to sufficiently attenuate, a signal with a high S/N ratio will be achieved. However, if a long period of several to a few tens of seconds are required to attenuate the output to a target dark output level, an apparatus will be of very low operating ease.

Accordingly, light irradiation with the LED light source is performed as the optical calibration operation. In performing X-ray irradiation in a short time, the LED light source is lit in advance in order to decrease a dark current of the photoelectric conversion element. A photocurrent passing at this time has no relationship with reading of image information. Lengths of the non-reading period or the reading period, or the emission period of the LED are designed with characteristics of a dark output of the photoelectric conversion element and an S/N ratio required for the photoelectric transducer.

A waveform indicated by an alternate long and short dash line illustrated as an output of the photoelectric conversion element in FIG. 13 is an output obtained when imaging is performed by turning on the LED light source 109 for a certain period of time during the non-reading period before imaging an object subjected to reading and by turning on the X-ray source 3 during the subsequent reading period.

During the non-reading period (F2), the LED light source 109 is turned on and a light is emitted to the photoelectric conversion element 105, so that a current as indicated by an alternate long and short dash line passes. Further, a photocurrent Ap90 passes, the LED light source 109 is turned off and, at the same time, the photocurrent disappears. At this time, dark currents Adp92 and Adp93 after turning off the LED light source 109 become more stable relative to time and in some cases smaller than when the LED light source 109 is not turned on. This is because light energy emitted from the LED permits excessive carriers produced inside a semiconductor layer to stabilize an inner state in the semiconductor layer, especially an interface portion and to make electrons or holes emit a light to be released. Radiographing an X-ray under such a low dark current state provides a signal with a high S/N ratio.

Specifically, emitting an LED light and decreasing a dark current with a timing during the non-reading period (F2) before the X-ray radiographing period (F3) provides an X-ray image with a high S/N ratio without waiting for a long time.

However, as described above, an effective quantity of light (light emission intensity×light emission period) cannot be emitted to a photoelectric conversion element with the same setting as in an initial use state because of a decrease in light emission intensity due to aging of the light source.

Such a state, that is, an output of the photoelectric conversion element and an output of the LED light source are indicated by solid lines in FIG. 13. FIG. 13 indicates that an output of the LED light source decreases and an output of the photoelectric conversion element 105 decreases (from initial Ap90 to Ap91) in turning on the light source. If a light source output decreases in this way, a dark current of a photoelectric conversion element output after light source OFF increases (from initial Adp93 to Adp99) to the photoelectric conversion element 5, thus decreasing an S/N ratio.

Especially, an EL light emitting device is used as a light source because a small, light and slim configuration can be achieved. Deterioration due to driving of the EL light emitting device or deterioration of light emission intensity with aging due to invasion of environmental moisture is severe and under initially established conditions (for example, supply voltage), a light source output drops early. For the above-described reason, by the quantity of light obtained at an initially established optical calibration setting, the quantity of light enough to produce a sufficient optical calibration effect will not be given to the photoelectric conversion element in long-term use.

First Embodiment

Figure 1:
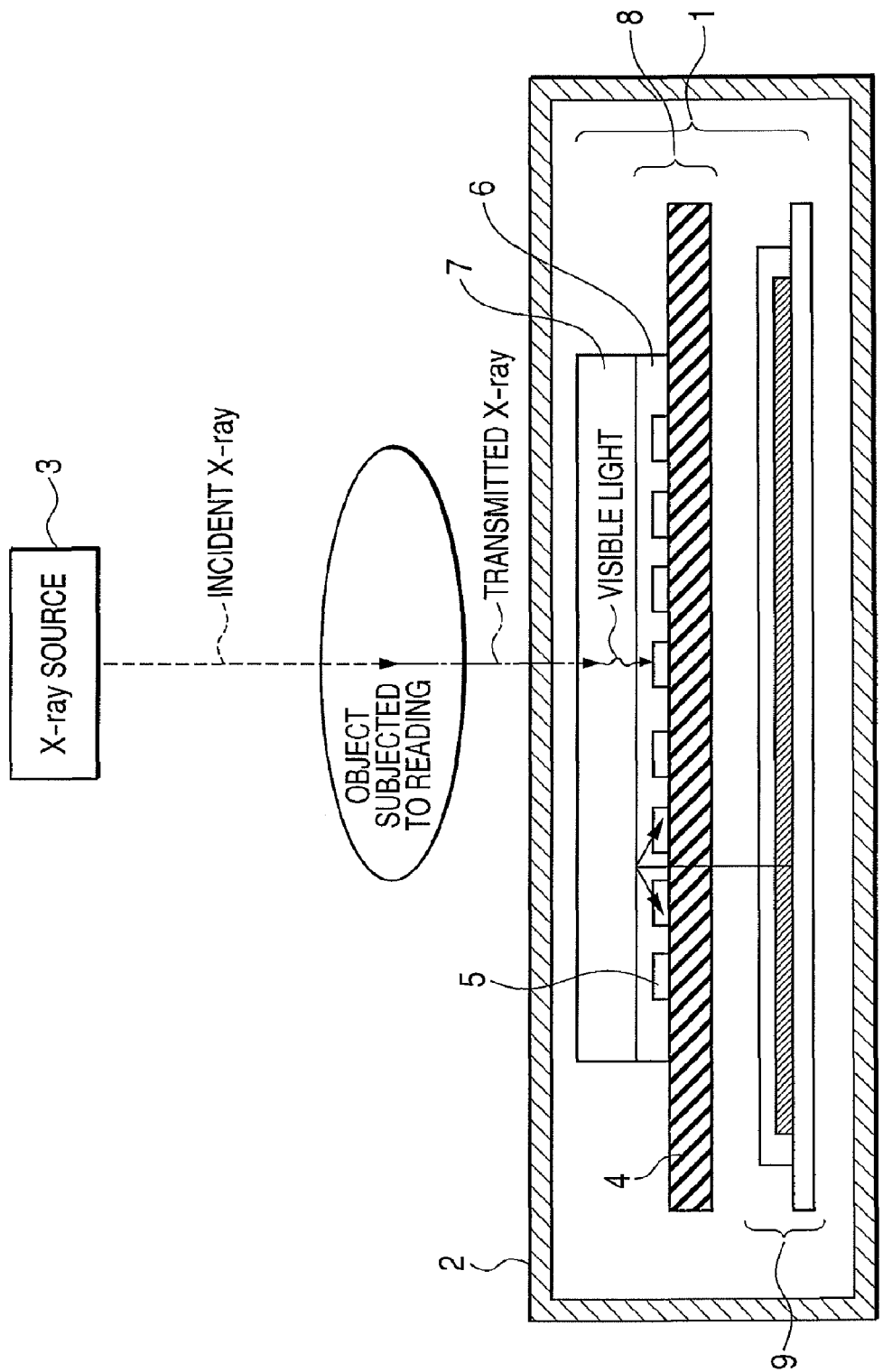
FIG. 1 is a schematic cross-sectional view of a radiation imaging apparatus according to a first embodiment of the present invention.

FIG. 1 is a schematic cross-sectional view of a radiation imaging apparatus according to a first embodiment of the present invention.

The radiation imaging apparatus 1 according to the present embodiment has the same configuration as the apparatus of the comparative example in FIG. 11 except that an EL (electroluminescence) light source 9 and a PIN photoelectric conversion element 105 are used to constitute an MIS photoelectric conversion element 5 in place of the LED light source 109.

FIG. 1 illustrates that the light from the EL light source 9 is vertically emitted to the scintillator 7, but an incident light from the diagonal direction also exists. Therefore, by including a specular reflection component over the scintillator surface, the scintillator will not absorb all light.

Figure 2:
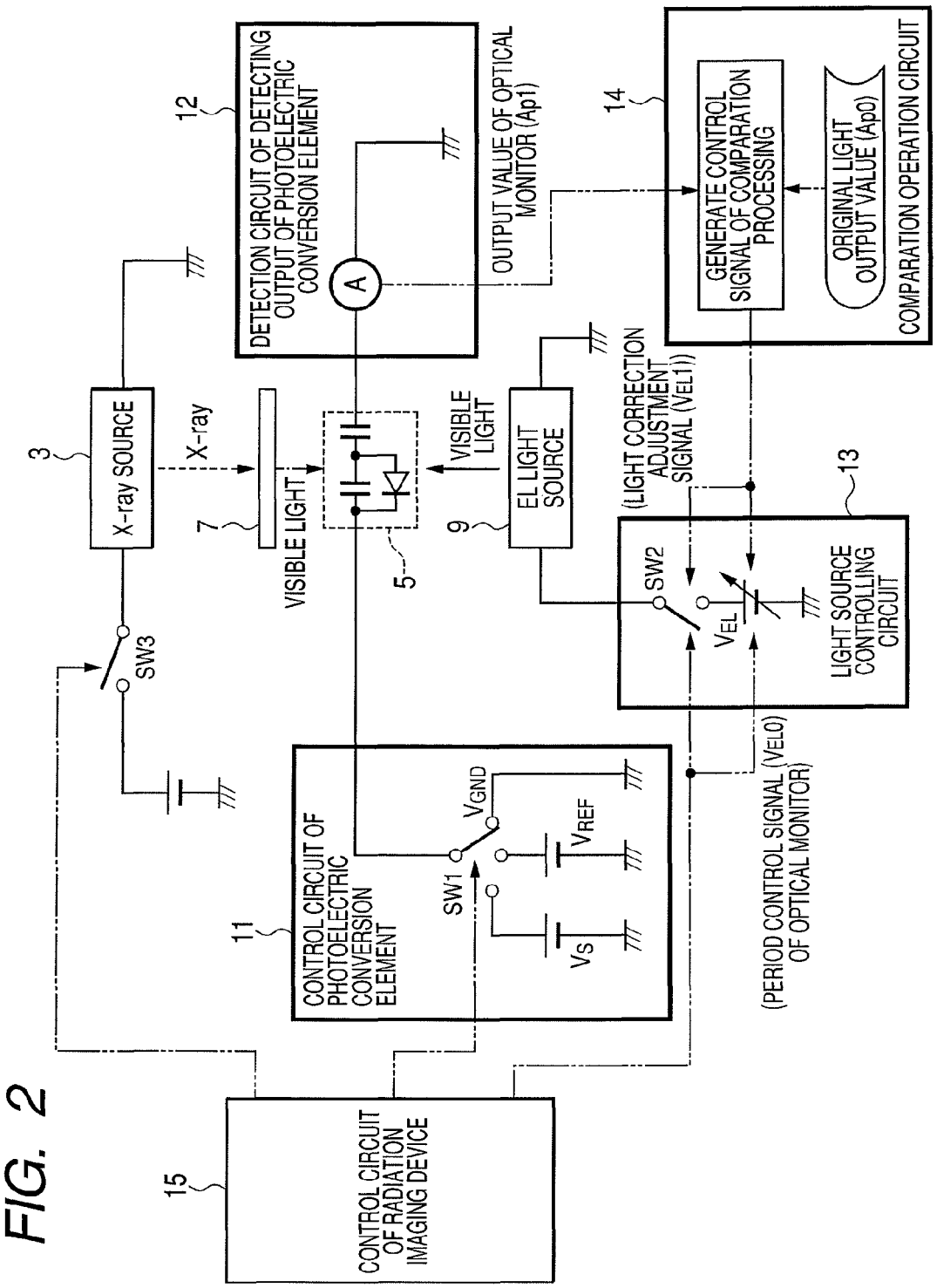
FIG. 2 is a circuit diagram of one pixel of a photoelectric conversion element in the radiation imaging apparatus.

FIG. 2 is a circuit diagram of one pixel of a photoelectric conversion element in the radiation imaging apparatus according to the present embodiment.

In FIG. 2, the photoelectric conversion element 5 is an MIS photoelectric conversion element the material of which is an amorphous silicon semiconductor. The MIS photoelectric conversion element is formed by layering an insulator and a semiconductor on a metal electrode layer at the lower portion. Generally, an injection inhibition layer (N layer or P layer) and an upper electrode are disposed over the semiconductor. A pair of the photoelectric conversion element and a switching device may be arranged on an isolated substrate as one pixel, which is omitted in FIG. 2.

In FIG. 2, a photoelectric conversion element control circuit 11 is connected with one electrode of the MIS photoelectric conversion element 5. In the photoelectric conversion element control circuit 11, three potentials are switched by a switch SW1. The three potentials are a power supply s (Vs) for giving a bias voltage for photoelectric conversion, a power supply ($V_{REF}$) for refreshing stored charges in the capacity of the MIS photoelectric conversion element 5 and a ground point (GND) for giving zero bias ($V_{GND}$) when the photoelectric conversion element is not operated. The other electrode is connected with a photoelectric conversion element output detection circuit 12. The photoelectric conversion element output detection circuit 12 includes an amplifier for amplifying a detection signal and an integrating circuit for storing detection currents and obtaining an output (output signal) at a certain time. In a case where a pair of the photoelectric conversion element and a switching device is arranged on an isolated substrate as one pixel, the switching device is electrically connected between the photoelectric conversion element 5 and the photoelectric conversion element output detection circuit 12.

Circuits 13, 14 are, for controlling an EL light source 9. The light source control circuit 13 includes a power supply $V_{EL}$ which can change a supply voltage to a light source and SW2 for controlling a light emission period. A comparing operation circuit 14 compares an optical monitoring output signal value obtained from a photoelectric conversion element output detection circuit 12 with a predetermined initial output signal value, arithmetically processes a voltage level and an output period of a light source and produces a control signal to the light source control circuit 13.

SW3 is a switch for lighting an X-ray source and is controlled by a radiation imaging apparatus control circuit 15 governing the timing of the whole radiation imaging apparatus.

In FIG. 2, the X-ray radiated from the X-ray source 3 to obtain images of an object subjected to reading is applied to an object not being illustrated (a patient in a hospital), passes through the patient and hits the scintillator 7.

Further, the X-ray is absorbed in the scintillator 7 and converted into a visible light. The visible light from the scintillator 7 is emitted to the photoelectric conversion element 5. FIG. 2 is a view for one pixel and does not illustrate a positional relationship between the photoelectric conversion element 5 and the scintillator 7. However, as illustrated in FIG. 1, the photoelectric conversion element 5 and the scintillator 7 are brought into substantially close contact with each other to improve an image resolution characteristic. To dispose the scintillator, one of two methods of direct vapor deposition and bonding with adhesive on a protective film is used. On the other hand, the visible light from the EL light source 9 as an additional light source is emitted to the photoelectric conversion elements 5 with a different optical path from the path of X-ray. SW3 is a switch for lighting the X-ray source 3.

Figure 3:
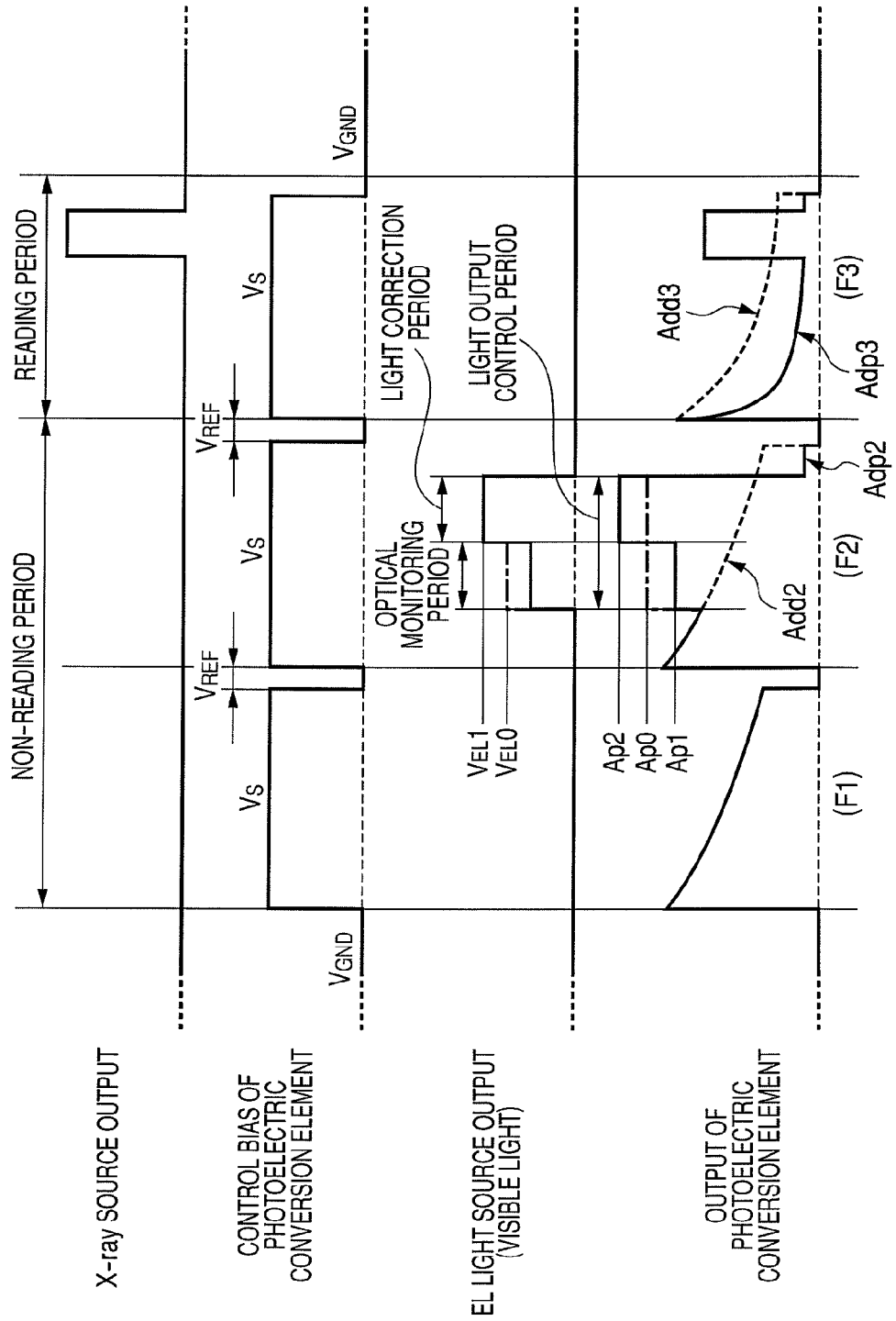
FIG. 3 is an operational timing chart of a circuit in the radiation imaging apparatus.

FIG. 3 is an operational timing chart of a circuit in the radiation imaging apparatus illustrated in FIG. 2.

Figure 4:
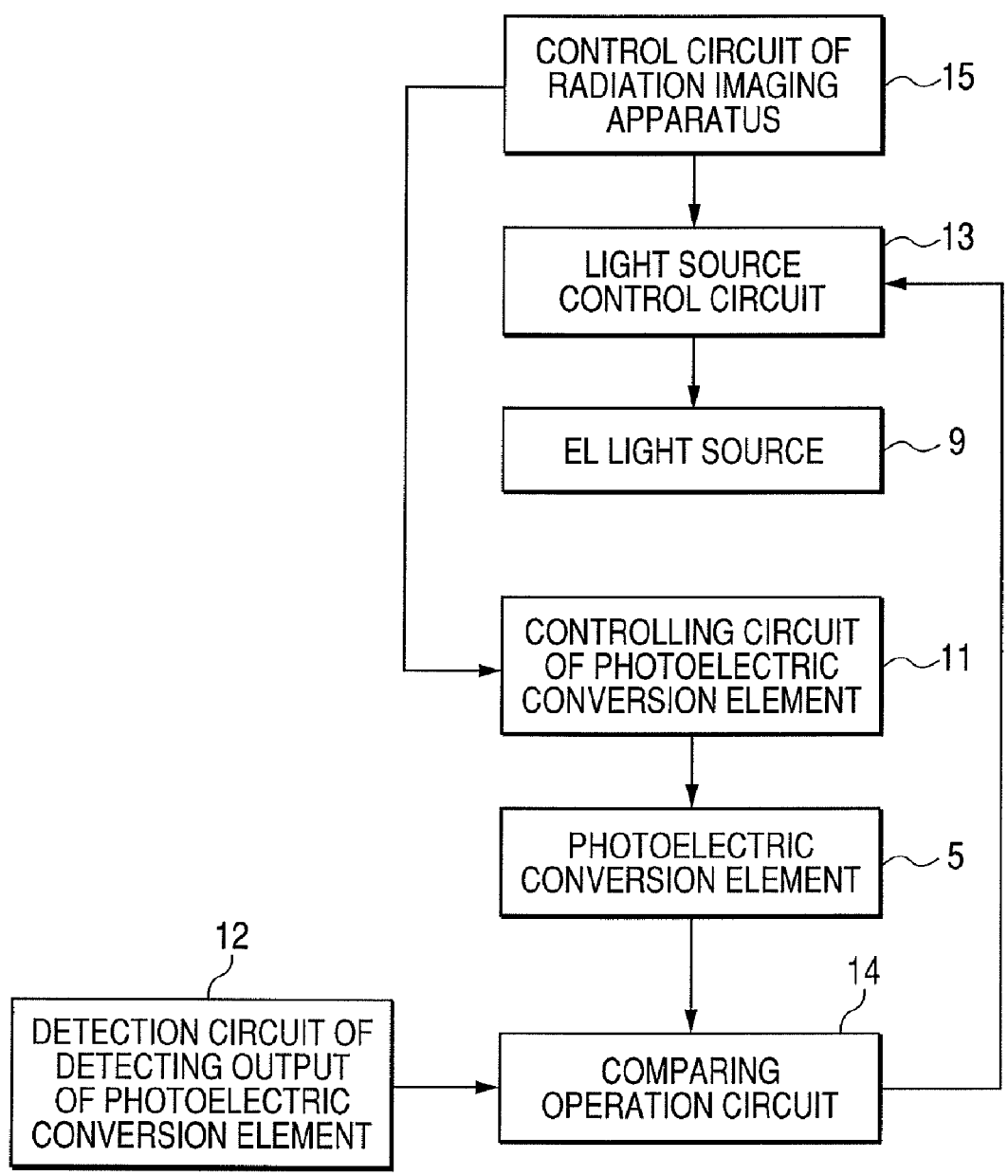
FIG. 4 is a view illustrating a flow of optical calibration in the radiation imaging apparatus.

FIG. 4 is a view illustrating a flow of optical calibration in the radiation imaging apparatus according to the present embodiment.

FIG. 3 illustrates biases and outputs of the X-ray source 3, the EL light source 9 and the photoelectric conversion element 5. Moreover, FIG. 3 illustrates a case where the photoelectric conversion element 5 is of one pixel as a photoelectric conversion substrate 8 for clear description.

Two operating periods: a reading period and a non-reading period are available. The X-ray source 3 lights up during the reading period, while the EL light source 9 lights up during the non-reading period. The medical X-ray imaging apparatus uses an X-ray source. However, for other applications such as non-destructive inspection, other types of radiations such as γ-ray may be used.

The light from the X-ray source 3 is not illustrated, but is radiated to an object to be radiographed to obtain image information of an object subjected to reading. In the case of a medical X-ray imaging apparatus, the object to be radiographed is the body of a patient coming to hospital. The light from the additional light source is not especially required to be radiated to an object subjected to reading. It is sufficient for the light to reach the photoelectric conversion element through some optical path.

As illustrated in FIG. 3, in driving for giving a bias voltage from the bias power supply Vs to the photoelectric conversion element 5, a refresh power supply $V_{REF}$ is periodically given to the photoelectric conversion element 5 as a refresh operation to sweep out charges stored in the photoelectric conversion element during driving. During a cycle (F2), the EL light source is lit for optical calibration and, during a cycle (F3), the X-ray source 3 is lit for imaging of an object subjected to reading. In an example illustrated in FIG. 3, the cycles (F1) and (F2) are taken as a non-reading period and the cycle (F3) is taken as a reading period.

Photocurrents Ap1 and Ap2 (solid lines) passed by emission of the light from the EL light source 9 are not read as image signals. Specifically, during the non-reading cycle (F2), the EL light source 9 is lit.

The photocurrents Ap1 and Ap2 pass through the photoelectric conversion element 5 by light emission of the EL light source 9, and, upon light OFF, the photoelectric conversion element is returned to such a state Adp2 that a dark current runs. However, FIG. 3 illustrates that after the EL light source 9 is OFF, a dark output Adp2 becomes lower and more stable than a dark output (dark current) Add2 (broken lines) when the EL light source 9 emits no light in the cycle (F2), which is illustrated in FIG. 3.

This is because the light energy of the EL light source is absorbed in the semiconductor layer, produced carriers gather on an insulated layer interface and the internal electric field in the semiconductor layer is released, so that the number of carriers flowing from an injection inhibition layer decreases. In the next cycle (F3), there is an advantage that produced carriers by light emission of the EL light source 9 in the cycle (F2) provides driving for several cycles in a dark state. Accordingly, a dark output Adp3, which is lower and more stable than the dark output Add3 (broken lines) when the EL light source 9 emits no light in the cycle (F2), can be obtained from the initial output. Further, it is thought that the number of electrons or holes contributing to previously trapped dark current is decreased by light emission.

Radiating an X-ray under a low state of the dark current provides a signal with a high S/N ratio.

Specifically, if the magnitude of the dark current is reduced by emitting the light of EL light source before X-ray radiophotographing, an X-ray image with a high S/N ratio can be achieved without need of long waiting.

By operation of the non-reading cycle (F2), the next cycle (F3) is a cycle with a low magnitude of dark current. Specifically, it may be thought that the cycle is the same as that with a saturated behavior of a dark current after a cycle (F6) in FIG. 3. Irradiating an X-ray to the reading period cycle (F3) will provide a signal with a high S/N ratio. If a signal of a cycle (F4) is incorporated and subtraction processing is performed from an X-ray output of the cycle (F3), which is not illustrated, a fixed component of a dark current included in a signal X-ray of the cycle (F3) will be corrected. Accordingly, if the magnitude of the dark current is lowered by emitting the light of the EL light source before X-ray radiographing, an X-ray image with a high S/N ratio will be achieved without need of long waiting.

By emitting the light of the EL light source 9 to the photoelectric conversion elements 5 by a desired quantity in the cycle (F2), the photoelectric conversion element 5 is in a stable state with a low magnitude of dark current during a reading period.

Referring next to FIGS. 2 to 4, a light emission method of the EL light source 9, that is, a control method of the EL light source 9 during the cycle (F2) will be described below.

In FIG. 3, light emission from the EL light source 9 is performed during a light output adjustment period and further the light output adjustment period has an optical monitoring period and a subsequent light correction period.

First, during an optical monitoring period of the cycle (F2), a light source supply power $V_{EL}$ of the light source control circuit 13 in FIG. 2 is adjusted and set to a predetermined light source intensity setting value $V_{EL}0$ corresponding to a light monitor period control signal by a radiation imaging apparatus control circuit 15.

Then the light source lighting switch SW2 is turned on to cause the EL light source 9 to emit a light. The photoelectric conversion element 5 which has received the illuminating light outputs an output Ap1 (solid line) illustrated in FIG. 3. An output from the photoelectric conversion element 5 is comparatively processed based on the output value Ap1 detected by the photoelectric conversion element output detection circuit 12 and an optical monitoring period, and an initial output signal value Ap0 (alternate long and short dash lines) which is a detection output preset in a comparing operation circuit and a light correction period. A light source output in the light output control period is arithmetically processed by the comparing operation circuit 14 illustrated in FIG. 2 to calculate a light source intensity setting value $V_{EL}1$ corresponding to a light correction and adjustment signal in a light correction period as the next period illustrated in FIG. 3.

Next, during the light correction period illustrated in FIG. 3, a control signal of the $V_{EL}1$ adjusted by the arithmetical processing described above is transmitted to the light source control circuit 13 from the comparing operation circuit 14. The light source supply power $V_{EL}$ is adjusted and controlled to $V_{EL}1$ and the EL light source 9 performs emission of the light with light source intensity corresponding to a voltage during the light correction period, that is, a period up to completion of light output adjustment period.

In the present embodiment, an output signal of the photoelectric conversion element 5 mounted on the photoelectric conversion substrate 8 with the intensity of light emission from the EL light source 9 is detected by the photoelectric conversion element output detection circuit 12, and deterioration of the light source can be observed by the comparing operation circuit 14 based on the predetermined output signal value and period.

Accordingly, the deterioration level of the EL light source 9 is detected and the light emission intensity of the EL light source 9 is then adjusted, thereby maintaining the quantity of light emission onto the photoelectric conversion element 5 constant within the light emission period (light output adjustment period) of the EL light source 9. Thus, even if light source intensity is lowered by deterioration of the EL light source 9 with long-term use, the quantity of light required to obtain an optical calibration effect can be controlled over a long term. Further, a radiation imaging apparatus with long service life can be achieved which has a high S/N ratio, high sensitivity, a short radiographing cycle, high operation ease and long-term performance maintenance.

FIG. 3 is a timing chart illustrating cycles (F1) and (F2) as a non-reading period and a cycle (F3) as a reading period. Needless to say, the cycle (F1) may be taken as a non-reading period and the cycle (F2) may be taken as a reading period. In that case, the time up to X-ray irradiation is further shortened.

In FIG. 2 illustrating the present embodiment, the supply power $V_{EL}$ of the EL light source 9 is illustrated with a symbol of a variable DC power supply, but in reality, is an inverter power supply, and the light emission intensity is controlled by varying an amplitude voltage of an inverter output. In addition, as a method for changing the light emission intensity, the frequency of a voltage amplitude may be changed.

In the present embodiment, the adjustment is made only with light emission intensity in the light correction period during which the EL light source 9 emits light to adjust the quantity of light emission to the photoelectric conversion element. Further, the length of the correction period may be adjusted for adjustment of the quantity of light emission to the photoelectric conversion element.

Figure 5:
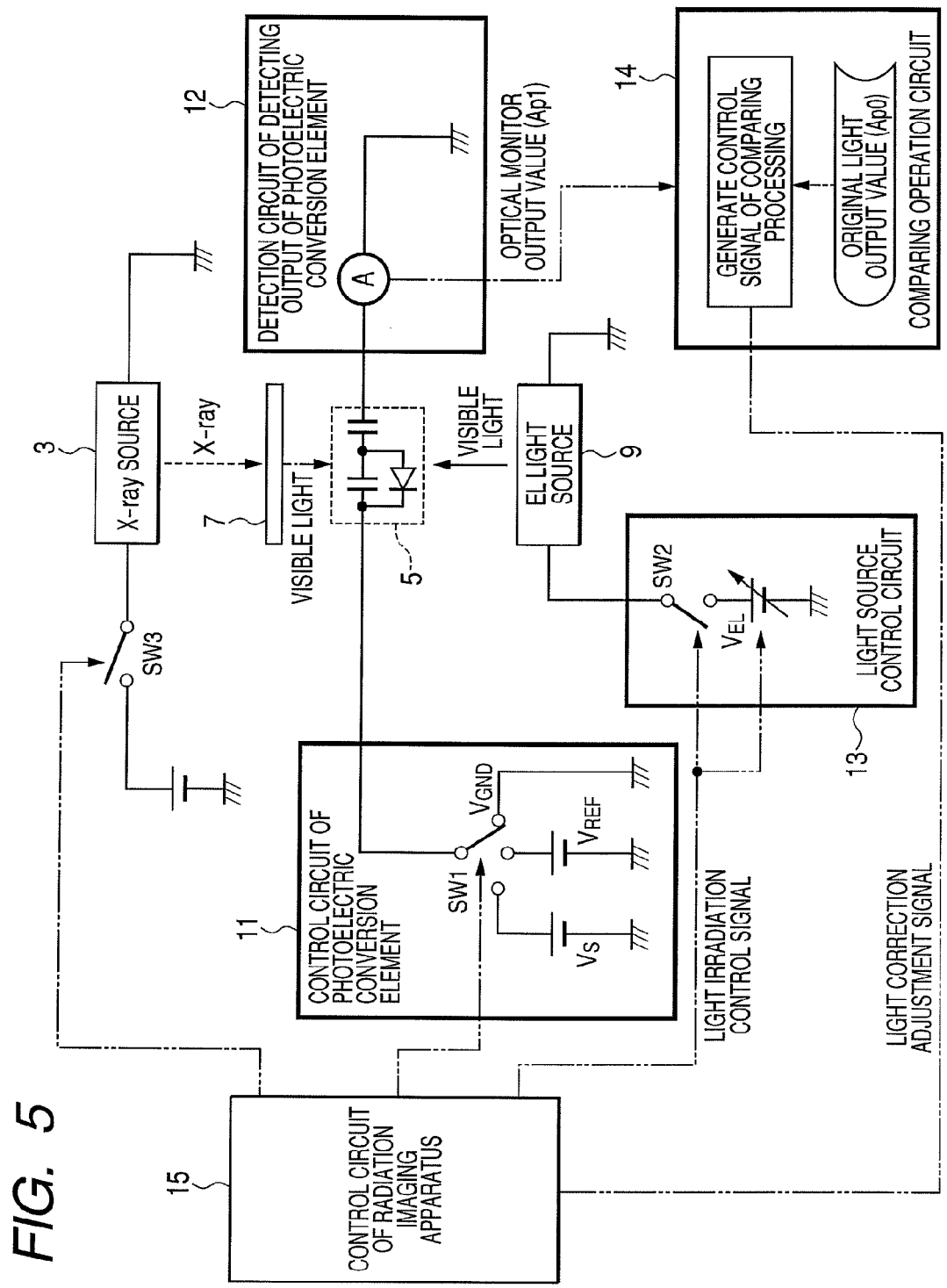
FIG. 5 is a schematic circuit diagram of a radiation imaging apparatus according to a second embodiment of the present invention.

In FIG. 2, the light correction and adjustment signal ($V_{EL}1$) is output to the light source control circuit 13, but a configuration illustrated in FIG. 5, described in a second embodiment provides the same effect of the present invention. FIG. 5 illustrates a configuration for outputting to the radiation imaging apparatus control circuit 15, which is different from that in FIG. 2. In the case of this configuration, a light correction and adjustment signal is output to the light source control circuit 13 from the radiation imaging apparatus control circuit 15 as a light emission control signal, thus adjusting light emission from the EL light source 9. At the same time, the completion time of the cycle (F2) can be also controlled based on the correction period of the light correction adjustment signal. In a case where a pair of the photoelectric conversion element and a switching device is arranged on an isolated substrate as one pixel, the output of each of the light monitor period and light correction period from a pixel having the photoelectric conversion element and the switching device can be read out as follows: (1) after the light source is changed from ON to OFF, the switching device is turned on for reading out; (2) at least in the latter half of a light source ON period, the switching device is turned on for reading out; (3) a combination of (1) and (2) described above is used for reading out. These operations are applicable in the same way to the following description.

The above description is made on an indirect radiation imaging apparatus having photoelectric conversion elements as the conversion elements of the present invention, of which material is amorphous silicon semiconductor and which convert light into electric signals. However, the conversion element, of which material is amorphous selenium semiconductor and which converts radiation into an electric signal, is applicable to a direct radiation imaging apparatus as well.

Second Embodiment

The present embodiment involves control of optical calibration for adjusting the length of a light emission period as well as the quantity of light irradiation to a photoelectric conversion element without the optical monitoring period present in the first embodiment.

Referring now to accompanying drawings, detailed description is made on the present embodiment.

A radiation imaging apparatus according to the present embodiment is the same as the apparatus in the first embodiment of FIG. 1.

FIG. 5 is a schematic circuit diagram of the radiation imaging apparatus according to the present embodiment.

Figure 6:
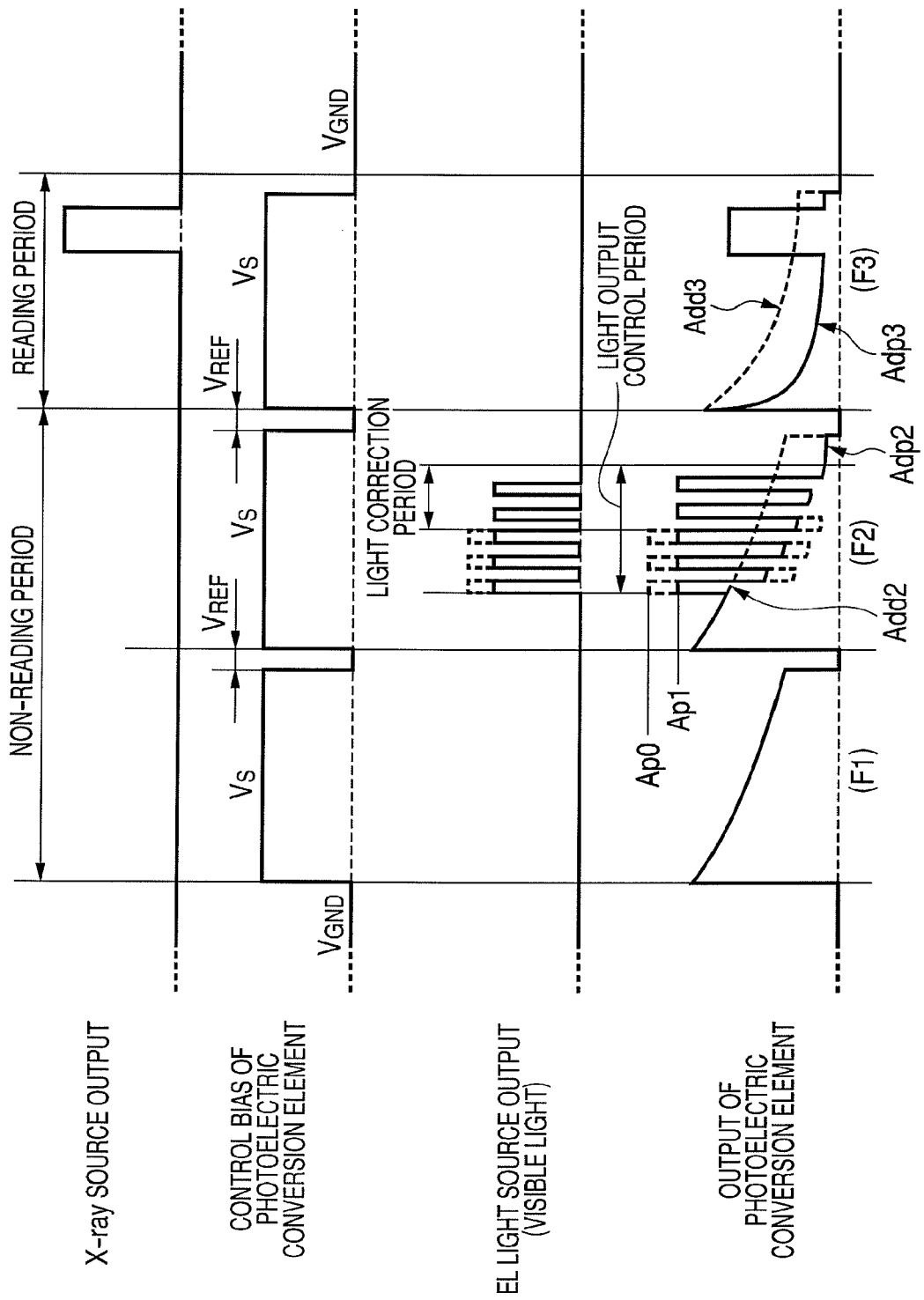
FIG. 6 is an operational timing chart of a circuit in the radiation imaging apparatus.

FIG. 6 is an operational timing chart of a circuit in the radiation imaging apparatus according to the present embodiment.

Figure 7:
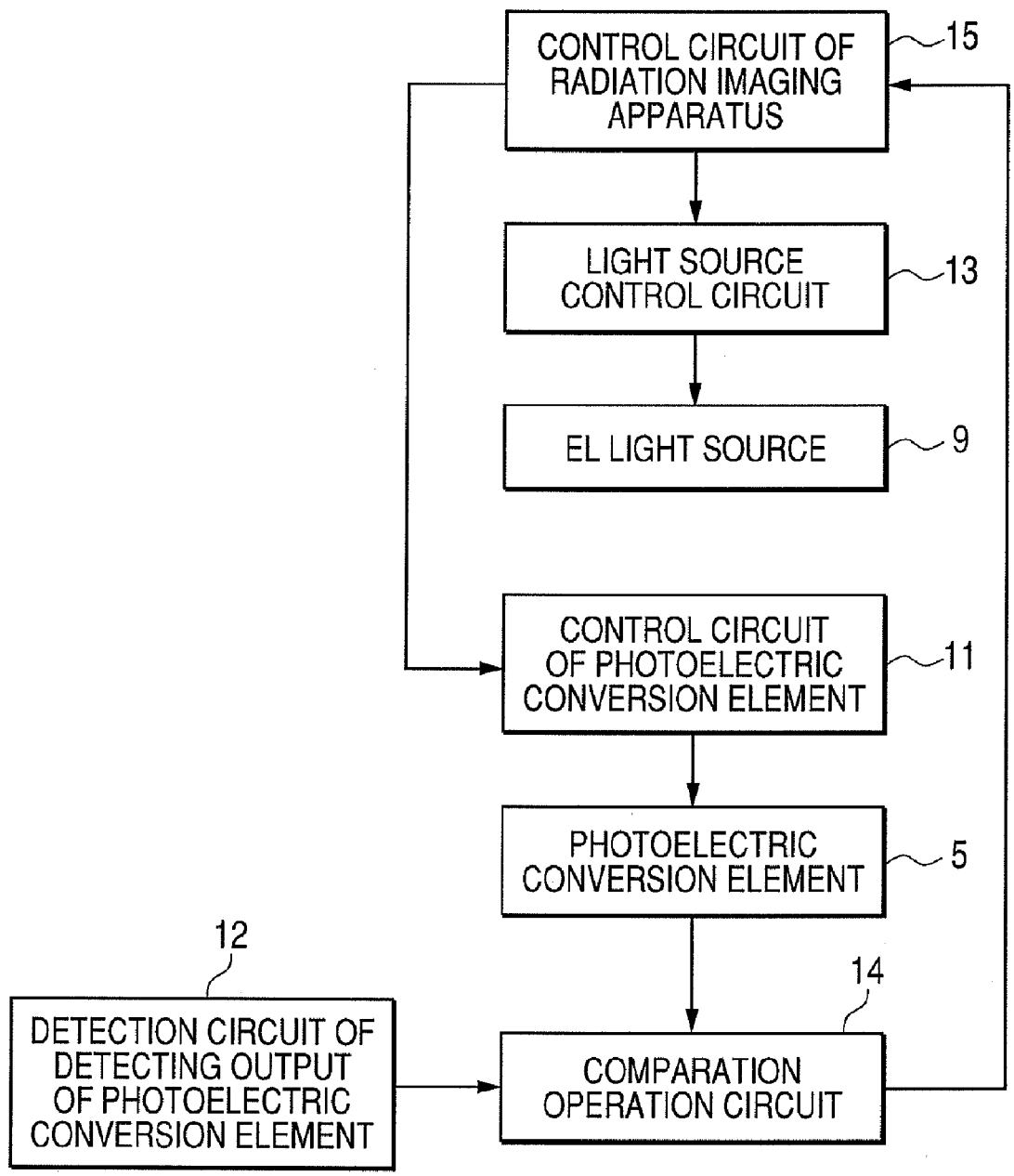
FIG. 7 is a view illustrating a flow of optical calibration in the radiation imaging apparatus.

FIG. 7 is a view illustrating a flow of optical calibration in the radiation imaging apparatus according to the present embodiment.

Figure 8:
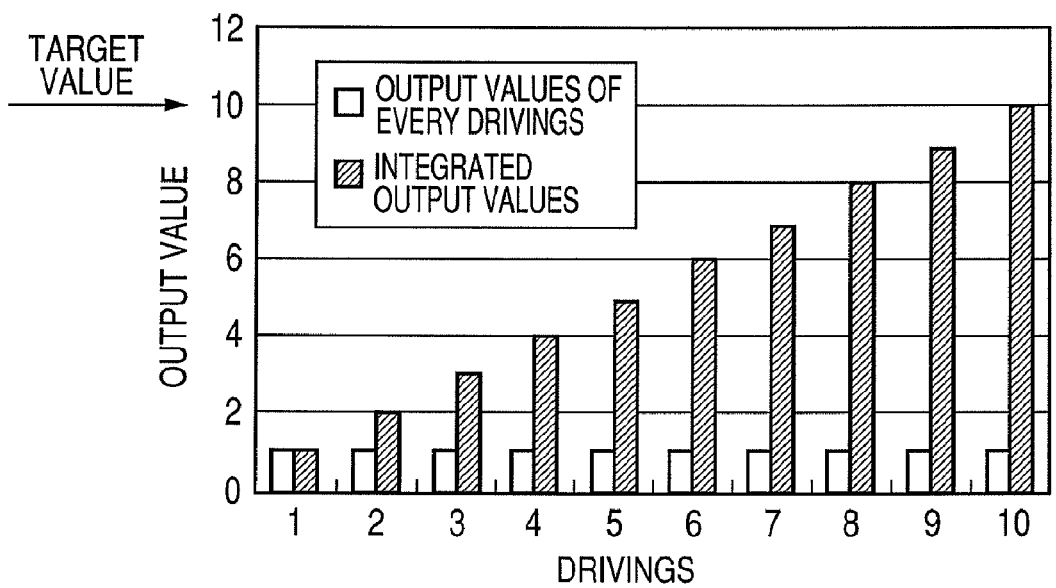
FIG. 8 is a graph illustrating an output of a photoelectric conversion element relative to the number of driving in the radiation imaging apparatus.

FIG. 8 is a graph illustrating an output of a photoelectric conversion element relative to the number of drivings of a light source in the radiation imaging apparatus according to the present embodiment.

FIG. 8 illustrates a graph of which horizontal axis shows the number of drivings of a light source and of which vertical axis shows an output of an electric signal from a photoelectric conversion element substrate at that time. The output of the electric signal is an integrated output value obtained by integrating an output value at every time as an output for each driving with an output value at every time. The output value in FIG. 8 is a stored output obtained by storing output currents of the photoelectric conversion elements during a certain period of time.

The optical calibration is performed so as to drive the light source immediately before radiophotographing and turn off driving of the light source when the photoelectric conversion element has reached a saturated state.

In a circuit on FIG. 2, the light correction and adjustment signal ($V_{EL}1$) is output to the light source control circuit 13. However, FIG. 5 illustrates a configuration giving an output to the radiation imaging apparatus control circuit 15, which is the point different from the configuration in FIG. 2. In such a configuration, a light correction and adjustment signal is output to the light source control circuit 13 as a light emission control signal from the radiation imaging apparatus control circuit 15, so that light emission of the EL light source 9 is adjusted.

In FIGS. 5 and 7, a run command of the optical calibration is given, almost at the same time, to the light source control circuit 13 and the photoelectric conversion element control circuit 11 from the radiation imaging apparatus control circuit 15. The light source control circuit 13 which has received the command injects a predetermined quantity of currents into the EL light source 9 to perform driving for a predetermined time. The photoelectric conversion element control circuit 11 which has received the command at almost the same time as for light source driving drives the photoelectric conversion element 5 and stores the light from the EL light source 9 for almost the same time as the driving period of the light source.

A stored output of the photoelectric conversion element 5 corresponding to the quantity of light emitted from the EL light source at the same time as when the EL light source 9 is turned off is detected by the photoelectric conversion element output detection circuit 12 and an output signal as an electric signal is output to the comparing operation circuit 14.

The comparing operation circuit 14 converts electric signals into numbers for storage and compares the numerical values with fixed target values of outputs of electric signals generating a saturated state of the photoelectric conversion element, as illustrated in FIG. 8. If the outputs of the electric signals do not reach the target values, driving of the EL light source 9 is executed again for the radiation imaging apparatus control circuit 15 and detection of outputs from the photoelectric conversion element 5 is started. The comparing operation circuit 14 integrates outputs of electric signals each time outputs from the photoelectric conversion element 5 are detected, compares the integrated value with a target value and determines necessity of the next output detection. The comparing operation circuit 14, when the integrated output value of the outputs of electric signals has reached the target value, optical calibration, that is, a signal for stopping light source driving, is output to the radiation imaging apparatus control circuit 15.

In an operational timing chart of a circuit illustrated in FIG. 6, a photoelectric conversion output is an output current value of a photoelectric conversion element in the same way as in FIG. 3 in the first embodiment. Similarly, a broken line indicating an output of each item is the same as that in the description of the first embodiment.

In FIG. 6, the outputs of the items in the operations described with FIGS. 5 and 7 described above are indicated by alternate long and short dash lines and solid lines. The alternate long and short dash lines indicate operational states in an initial state of the EL light source. The solid lines illustrate such operating states that an output of the EL light source changes (lowers), an output of the photoelectric conversion element lowers from Ap0 to Ap1 and the quantity of light emission of the EL light source is adjusted and controlled (number of light emissions).

As illustrated in FIG. 5, a light correction and adjustment signal illustrated in the present embodiment is output as a light emission control signal from the radiation imaging apparatus control circuit to the light source control circuit 13, thereby adjusting light emission of the EL light source 9. In addition, the photoelectric conversion element control circuit 11 can be also controlled and a run cycle of optical calibration can be stopped together with a driving stop of the light source.

Accordingly, shifting to a cycle F3 can be made without need of waiting for a light correction period illustrated in a cycle F2 on FIG. 6, thus shortening a reading period to the cycle F3, that is, the time up to X-ray irradiation and radiographing. Further, the driving illustrated in the present embodiment is applicable during the light correction period in the first embodiment.

Third Embodiment

The present embodiment is the same as the second embodiment and involves control of optical calibration for adjusting the length of light emission period as well as the quantity of light irradiation to a photoelectric conversion element without the optical monitoring period present in the first embodiment.

Referring now to accompanying drawings, detailed description is made on the present embodiment.

For the schematic circuit illustrated in FIG. 5, the operational timing illustrated in FIG. 6 and the flow of optical calibration illustrated in FIG. 7, which are illustrated in the second embodiment, the present embodiment has the same.

Figure 9:
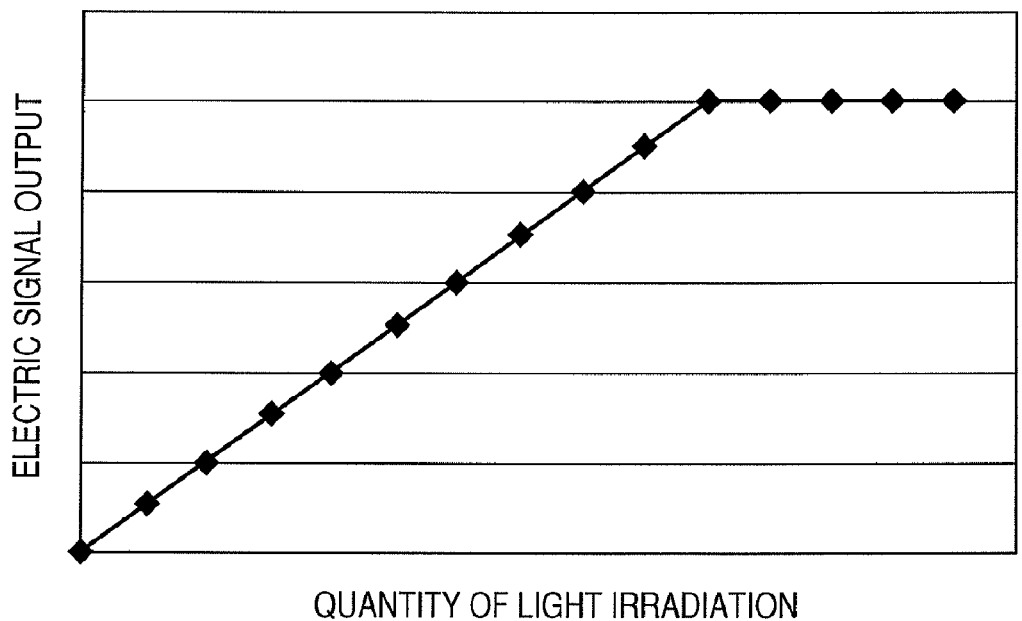
FIG. 9 is a graph illustrating an output of a photoelectric conversion element relative to a quantity of light irradiation in a radiation imaging apparatus according to a third embodiment of the present invention.

FIG. 9 is a graph illustrating a relationship between an output of an electric signal of a photoelectric conversion element and a quantity of light emission in the present invention.

In FIG. 9, the horizontal axis shows a quantity of light from the EL light source 9 and FIG. 9 illustrates that a quantity of incident light becomes larger or an integrated quantity of light becomes larger on the right side of the graph. The vertical axis indicates a magnitude of an output signal as an electric signal output by the photoelectric conversion element relative to the light. An output value in FIG. 9 indicates an output current of the photoelectric conversion element in the form of an output stored for a certain period of time. The photoelectric conversion element 5 of MIS type for use in the present embodiment outputs a signal from one end of a capacitor as shown in FIG. 2. Accordingly, when an output from the photoelectric conversion element 5 exceeds a maximum of the capacitor, the output would be saturated. An effective image signal cannot be derived thereby. That is a saturation characteristics of the photoelectric conversion signal. FIG. 9 indicates that the photoelectric conversion element is in a saturated state from a point when no change (increase) is made in an output value of an electric signal.

The present embodiment has a feature that optical calibration is performed using the above-described characteristic. The present embodiment is the same as the second embodiment, except that the comparing operation circuit 14 integrates outputs of electric signals stored and detected from the photoelectric conversion element 5 at every driving of the light source and determines whether or not a differential value to a previous integrated value is zero and whether or not the next light source driving is needed. The comparing operation circuit 14, when determining that the differential value has been almost zero, a signal for stopping optical calibration, that is, light source driving, is output to the radiation imaging apparatus control circuit 15.

With the optical calibration in the present embodiment, the light source is driven while an output of the photoelectric conversion element is being detected, and light source driving is stopped based on the fact that a saturated state is reached, thereby attaining optical calibration without time loss and with constantly high stability. Further, even if a quantity of light emission changes due to aging of the light source, light source driving is performed while an output of the photoelectric conversion element is being detected, thus constantly attaining a required saturated state.

On an operational timing chart of a circuit, the present embodiment is the same as in FIG. 6 of the second embodiment.

In case of showing, in a timing chart, an operation following to one corresponding to the point at which the electric signal output value in FIG. 9 has no change (increasing), the output of the photoelectric conversion element after driving of the EL light source would be a level of a dark current. That is, based on the output of the photoelectric conversion element after saturation, the output corresponding to the quantity of the irradiation with the light from the EL light source can not be obtained. The comparator circuit 14 determines the differential value as being reduced into approximately zero. And, then, the driving of the light source would be stopped.

And, also, in case of using the photoelectric conversion element of a photodiode type, the other element and the other wiring may be used to form a capacitor. And, the output may be once stored in the capacitor so formed, and readout therefrom. In such configuration, also, similar characteristics of output saturation can be provided. And, therefore, the present invention is applicable to such configuration.

The present invention including the first embodiment to the third embodiment uses a surface light-emitting type EL as a light source. The EL light source 9 is a light source having a light emission wavelength in an optical-absorption wavelength area of the photoelectric conversion element. As light sources, light sources such as a plurality of LED arrays arranged in a two-dimensional form in FIG. 11 illustrated in a comparative example, a plurality of cold-cathode tubes or fluorescent tubes arranged in a two-dimensional form, or a combination thereof with a light guide plate, may be used, thereby providing the same effect.

Figure 14:
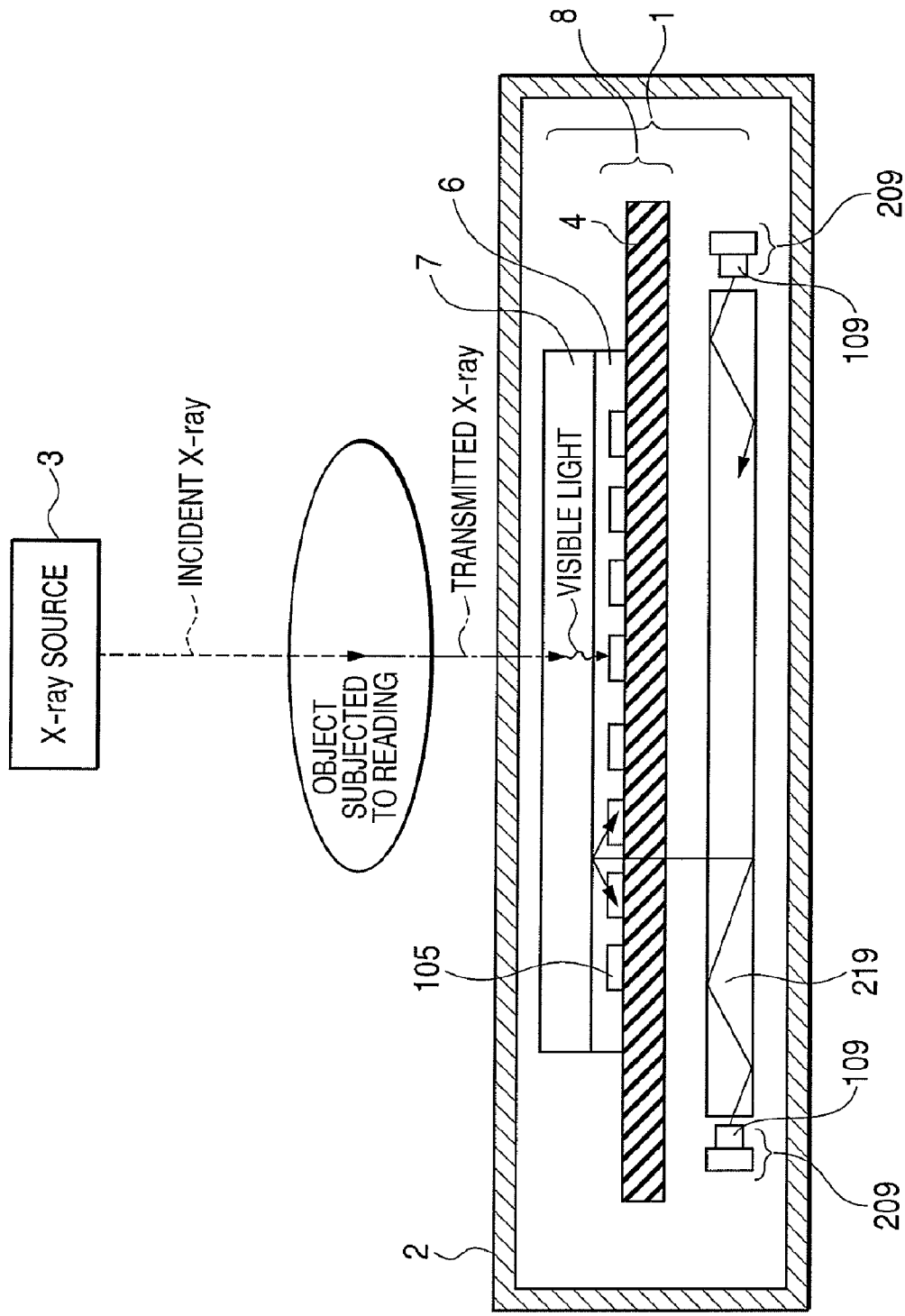
FIG. 14 is a schematic cross-sectional view of a radiation imaging apparatus with a two-dimensional irradiation light source.

FIG. 14 illustrates a schematic cross-sectional view of a radiation imaging apparatus with a two-dimensional irradiation light source constituted of a combination of LED arrays arranged in a line manner as an example of a light source combined with the light guide plate. The LED arrays 209 arranged with the LED light sources 109 in a line manner are arranged on both sides of the light guide plate 219 formed out of acryl resin. The light guide plate 219 is disposed in at least an equivalent area to the photoelectric conversion elements arranged in a two-dimensional manner on the backside of the photoelectric conversion substrate 8. The light emitted by the LED light source 109 enters the side surface of the light guide plate 219, transmits while reflecting over the inner light guide plate, so that the light is emitted in a direction of the photoelectric conversion substrate 8 by a scattering pattern or shape formed on the front or back of the light guide plate, thus providing a two-dimensional light-emitting surface.

The EL light source is apt to have severe deterioration due to driving of an EL light-emitting diode or deterioration of light emission intensity with aging due to invasion of environmental moisture. However, use of the present invention provides long-term maintenance of initially established quantity of light, thus attaining a sufficient optical calibration effect.

Furthermore, the surface light-emitting EL has little uneven in-surface light emission because of an integrated type and evenly changes in the surface not to make the inner surface uneven even if aging occurs, thereby attaining more preferable optical calibration than other light sources. Each LED or cold-cathode tube, having a some height, is large in the thickness direction and is heavy. On the other hand, the EL, being sheet-like, having a thickness of 0.2 to 0.3 mm and being very light, can attain an optical calibration system capable of easy mounting and reductions in size and weight.

Moreover, in the second embodiment described below, optical calibration is completed when an integrated output value of a signal intermittently output from the photoelectric conversion element 5 by repeating turning on and off the EL light source 9 for driving reaches a target value. However, needless to say, the EL light source 9 has the same effect as that of the second embodiment even if the light source is turned off when the EL light source 9 is turned on with a command of the radiation imaging apparatus control circuit 15 and only output detection of the photoelectric conversion element 5 at every certain time is repeated while continuous driving is being performed so that the integrated value reaches a target value.

Similarly, the third embodiment also provides the same effect as the second embodiment even if the light source is turned off when only output detection of the photoelectric conversion element 5 at every certain time is repeated while continuous driving of the EL light source 9 is being performed and no change in the differential value is made. In this case, it is sufficient for the radiation imaging apparatus control circuit 15 to make only commands of driving start and driving stop for the light source control circuit 13 and to monitor the responses of the photoelectric conversion element control circuit 11 and the comparing operation circuit 14 after the driving starts.

Further, the driving illustrated in the present embodiment is applicable during the light correction period of the first embodiment.

The radiation imaging apparatus according to the present invention provides constantly stable optical calibration and stable and accurate continuous radiographing.

Fourth Embodiment

Figure 10:
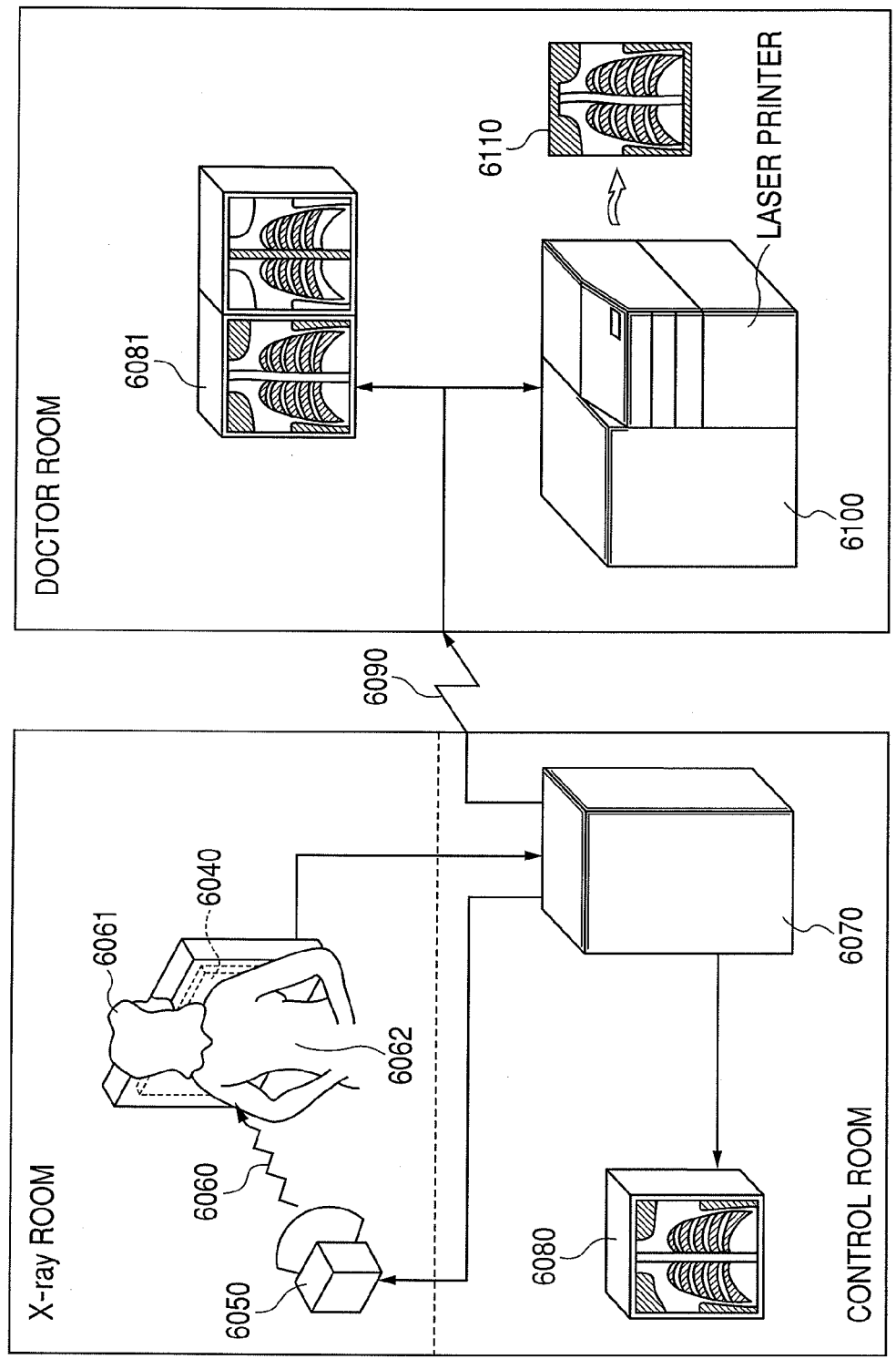
FIG. 10 is a view illustrating an example to which a radiation imaging apparatus of the present invention is applied as a radiation imaging system.

FIG. 10 is a view illustrating an example to which a radiation imaging apparatus of the present invention is applied as a radiation imaging system.

The radiation imaging apparatus is a radiation imaging apparatus in each embodiment described above.

An X-ray 6060 generated at an X-ray tube 6050 passes through a chest 6062 of a patient or a subject 6061 and a radiation image is launched into a radiation imaging apparatus 6040 for radiographing a radiation image. The incoming X-ray includes information of the inner body of the patient 6061. A wavelength converter of the radiation imaging apparatus 6040 emits a light and the light is photoelectrically converted to obtain electrical information. The information is converted into digital and image processing is performed by an image processor 6070 and can be observed through a display unit 6080 as display unit provided in a control room.

Furthermore, the information can be transferred to even a distant place through a transmission system such as a telephone line 6090 and displayed on a display unit 6081 provided in a doctor room or the like of a different location or stored in a storage medium such as an optical disc. This enables a doctor at a distant place to perform a diagnosis. In addition, the information can be recorded on a film 6110 by a film processor 6100.

Capable of Exploitation in Industry

As described above, the present invention is applicable to a digital X-ray imaging apparatus for medical use and further effective in applying to a digital radiation imaging apparatus for other radiation applications such as non-destructive inspection.

As many apparently widely different embodiments of the present invention can be made without departing from the spirit and scope thereof, it is to be understood that the invention is not limited to the specific embodiments thereof except as defined in the claims.

This application claims priority from Japanese Patent Applications No. 2006-297720, filed Nov. 1, 2006 and No. 2007-276519, filed Oct. 24, 2007, which are hereby incorporated by reference herein in their entirety.

The invention claimed is:

1. A radiation imaging apparatus comprising:
   a plurality of conversion elements being arranged in one dimensional or two dimensional array on a substrate, and converting incident electromagnetic radiation into an electric signal;
   a light source for irradiating the conversion elements with light for calibration of the conversion elements; and
   a comparing unit for comparing an output signal from the conversion elements with a predetermined initial output signal, to adjust a driving level of the light source.

2. The radiation imaging apparatus according to claim 1, wherein the comparing unit compares an output signal from the conversion elements with a predetermined initial output signal, to adjust a driving level of the light source in a period of adjusting light output, including a light monitoring period and a light correction period following the light monitoring period, and wherein the comparing unit detects an output signal from the conversion elements during the monitoring period, and adjusts a light emission intensity of the light source based on a control signal generated based on the comparison of the output signal with the predetermined initial output signal during the light correction period.

3. The radiation imaging apparatus according to claim 1, wherein the comparing unit compares an output signal from the conversion elements with a predetermined initial output signal, to adjust a driving level of the light source in a period of adjusting light output, including a light monitoring period and a light correction period following the light monitoring period, and wherein the comparing unit detects an output signal from the conversion elements during the monitoring period, and adjusts a light emission duration of the light source based on a control signal generated based on the comparison of the output signal with the predetermined initial output signal during the light correction period.

4. The radiation imaging apparatus according to claim 1, wherein the comparing unit adjusts the light source such that the light source is intermittently turned on and off, and, when an integrated quantity of the output signal from the conversion elements for every time of turning on the light source increases to a predetermined level, the driving of the light source is stopped.

5. The radiation imaging apparatus according to claim 1, wherein the comparing unit adjusts the light source such that the light source is intermittently turned on and off, and, when a differential value of an integrated quantity of the output signal from the conversion elements for every time of turning on the light source decreases in zero, the driving of the light source is stopped.

6. The radiation imaging apparatus according to claim 4, wherein the comparing unit adjusts the light source by turning on or off synchronously with a time period of detecting the output from the conversion elements.

7. The radiation imaging apparatus according to claim 1, wherein the comparing unit adjusts the light source such that the light source is continuously driven, and, when an integrated quantity of the signal outputted intermittently from the conversion elements increases in a predetermined level, the driving of the light source is stopped.

8. The radiation imaging apparatus according to claim 1, wherein the comparing unit adjusts the light source such that the light source is continuously driven, and, when a differential value of an integrated quantity of the signal outputted intermittently from the conversion elements decreases in zero, the driving of the light source is stopped.

9. The radiation imaging apparatus according to claim 1, wherein the conversion elements are driven so as to perform a refreshment to sweep out an electric charge accumulated in a conversion region of the conversion elements.

10. The radiation imaging apparatus according to claim 1, wherein the conversion elements each have an amorphous selenium semiconductor.

11. The radiation imaging apparatus according to claim 1, wherein the conversion elements each have an amorphous silicon semiconductor, and the radiation imaging apparatus further comprises a scintillator disposed over the conversion elements.

12. The radiation imaging apparatus according to claim 1, wherein the light source is an EL element.

13. A radiation imaging system comprising:
a radiation imaging apparatus according to claim 1;
a signal processing unit for processing a signal from the radiation imaging apparatus;
a recording unit for recording a signal from the signal processing unit;
a display unit for displaying the signal from the signal processing unit;
a transfer processing unit for transferring the signal from the signal processing unit; and
a radiation source for generating radiation.

14. The radiation imaging apparatus according to claim 5, wherein the comparing unit adjusts the light source by turning the light source on or off synchronously with a time period of detecting the output from the conversion elements.

* * * * *